United States Patent
Brist et al.

(10) Patent No.: US 7,797,826 B2
(45) Date of Patent: Sep. 21, 2010

(54) METHOD OF POWER-GROUND PLANE PARTITIONING TO UTILIZE CHANNEL/TRENCHES

(75) Inventors: Gary A. Brist, Yamhill, OR (US); Gary Baxter Long, Aloha, OR (US); Daryl A. Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/891,398

(22) Filed: Aug. 10, 2007

(65) Prior Publication Data

US 2008/0029295 A1 Feb. 7, 2008

Related U.S. Application Data

(62) Division of application No. 10/409,890, filed on Apr. 8, 2003, now Pat. No. 7,269,899, which is a division of application No. 10/068,229, filed on Feb. 4, 2002, now Pat. No. 6,747,216.

(51) Int. Cl.
*H01K 3/10* (2006.01)

(52) U.S. Cl. .............................. 29/852; 29/825; 29/830; 29/846; 174/262

(58) Field of Classification Search .................. 29/825, 29/830, 852, 846; 174/262, 282
See application file for complete search history.

(56) References Cited

U.S. PATENT DOCUMENTS

| | | | |
|---|---|---|---|
| 4,967,314 A | 10/1990 | Higgins, III | |
| 5,129,142 A | 7/1992 | Bindra et al. | |
| 5,219,639 A | 6/1993 | Sugawara et al. | |
| 5,304,743 A | 4/1994 | Sen et al. | |
| 5,426,399 A | 6/1995 | Matsubayashi et al. | |
| 5,451,721 A * | 9/1995 | Tsukada et al. | 174/261 |
| 5,473,120 A * | 12/1995 | Ito et al. | 174/264 |
| 5,489,554 A | 2/1996 | Gates | |
| 5,512,514 A | 4/1996 | Lee | |
| 5,527,741 A | 6/1996 | Cole et al. | |
| 5,714,718 A | 2/1998 | Tanaka | |
| 5,745,984 A | 5/1998 | Cole et al. | |
| 5,828,555 A * | 10/1998 | Itoh | 361/784 |
| 5,912,809 A | 6/1999 | Steigerwald et al. | |
| 6,000,120 A | 12/1999 | Arledge et al. | |
| 6,119,338 A * | 9/2000 | Wang et al. | 29/852 |
| 6,214,445 B1 | 4/2001 | Kanbe et al. | |
| 6,444,922 B1 | 9/2002 | Kwong | |
| 6,452,117 B2 * | 9/2002 | Curcio et al. | 174/262 |
| 6,713,685 B1 | 3/2004 | Cotton | |
| 6,747,216 B2 * | 6/2004 | Brist et al. | 174/255 |
| 6,753,481 B2 * | 6/2004 | Novak | 174/262 |

(Continued)

OTHER PUBLICATIONS

PCT Written Opinon for PCT Application No. PCT/US03/02360, dated Dec. 27, 2004.

(Continued)

*Primary Examiner*—C. J Arbes
(74) *Attorney, Agent, or Firm*—Blakely, Sokoloff, Taylor & Zafman LLP

(57) ABSTRACT

An apparatus that includes a plurality of metalized planes, one or more dielectric layers separating the plurality of metalized planes; and one or more conductive trenches connecting to at least one of the plurality of metalized planes.

6 Claims, 10 Drawing Sheets

U.S. PATENT DOCUMENTS

| | | | |
|---|---|---|---|
| 6,995,322 B2 * | 2/2006 | Chan et al. | 174/262 |
| 7,061,095 B2 | 6/2006 | Boggs et al. | |
| 7,269,899 B2 * | 9/2007 | Brist et al. | 29/853 |
| 2002/0130739 A1 | 9/2002 | Cotton | |
| 2002/0179335 A1 * | 12/2002 | Curcio et al. | 174/265 |

OTHER PUBLICATIONS

International Preliminary Examination Report for PCT Application No. PCT/US03/02360, dated Feb. 25, 2005.

International Search Report for PCT/US03/02360, mailing date Sep. 9, 2003 (6 pgs.).

* cited by examiner

SECTION A-A

METHOD OF POWER-GROUND PLANE
PARTITIONING TO UTILIZE
CHANNEL/TRENCHES

This patent application is a divisional application of U.S. patent application Ser. No. 10/409,890 filed on Apr. 8, 2003, now U.S. Pat. No. 7,269,899 which is a divisional of U.S. patent application Ser. No. 10/068,229, filed Feb. 4, 2002, entitled "Power-ground plane partitioning and via connection to utilize channel/trenches for power delivery", now U.S. Pat. No. 6,747,216, issued Jun. 8, 2004, and claims a priority benefit thereof.

FIELD OF THE INVENTION

The present invention pertains in general to circuit design and in particular to creating and utilizing conductive trenches to improve power delivery, EMI suppression, and/or thermal dissipation within a circuit structure.

BACKGROUND OF THE INVENTION

As printed circuit board designs have increased in complexity, the need for additional interconnect lines between the components coupled to the printed circuit boards have increased. To address this need, manufactures have provided multiple layer printed circuit boards where several layers of conductors are separated by layers of dielectric material. Printed circuit boards (PCBs) generally contain four or more conductive layers, where at least one conductive layer is a ground plane, one or more conductive layers are power planes and outer conductive layers that provide a high density interconnect for coupling various components or sockets, which have been mounted to the PCB. These multiple layer circuit boards are fabricated such the conductive layers are each separated by a dielectric layer so that the intermediate conductor layers providing power and the ground planes to the printed circuit board are not in contact except by vias. FIG. 1 illustrates a multiple layer printed circuit board where layered beneath the interconnect layers (not shown) is a first metalized layer to provide power, and a second metalized layer to provide ground and where the two metalized layers are separated by a dielectric layer (removed for clarity). A clearance space in a metalized layer may be provided around a via to avoid connecting with that layer.

The conductive layers of the multiple layer printed circuit boards can be connected to each other using vias, which are plated with conductive material to provide plated through holes. The vias are located across the printed circuit board and connected to mounting locations on the outer conductive planes using conductive traces. That is, mounting pads for integrated circuits and surface mount components may not be directly connected to plated through holes, but can be connected to the plated through hole locations using a patterned conductive trace. With the increased population density of integrated circuits, concerns about electromagnetic interference (EMI), power/heat dissipation, and power delivery increase.

For the reasons stated above, and for other reasons stated below which will become apparent to those skilled in the art upon reading and understanding the present specification, there is a need in the art for a printed circuit board which addresses the above concerns while maintaining current circuit board assembly quality, including solder joints.

BRIEF DESCRIPTION OF THE DRAWINGS

The present invention is illustrated by way of example and not limitation in the figures of the accompanying drawings, in which like references indicate similar elements and in which:

FIG. 4A is an illustration of the alternate embodiment for fabrication of metal circuitry.

FIG. 4B is an illustration of the alternate embodiment for adding more layers to the PCB.

FIG. 4C is an illustration of the alternate embodiment for using a die to imprint the PCB.

FIG. 4D is an illustration of the die imprint onto the PCB.

DETAILED DESCRIPTION

Figure 1:
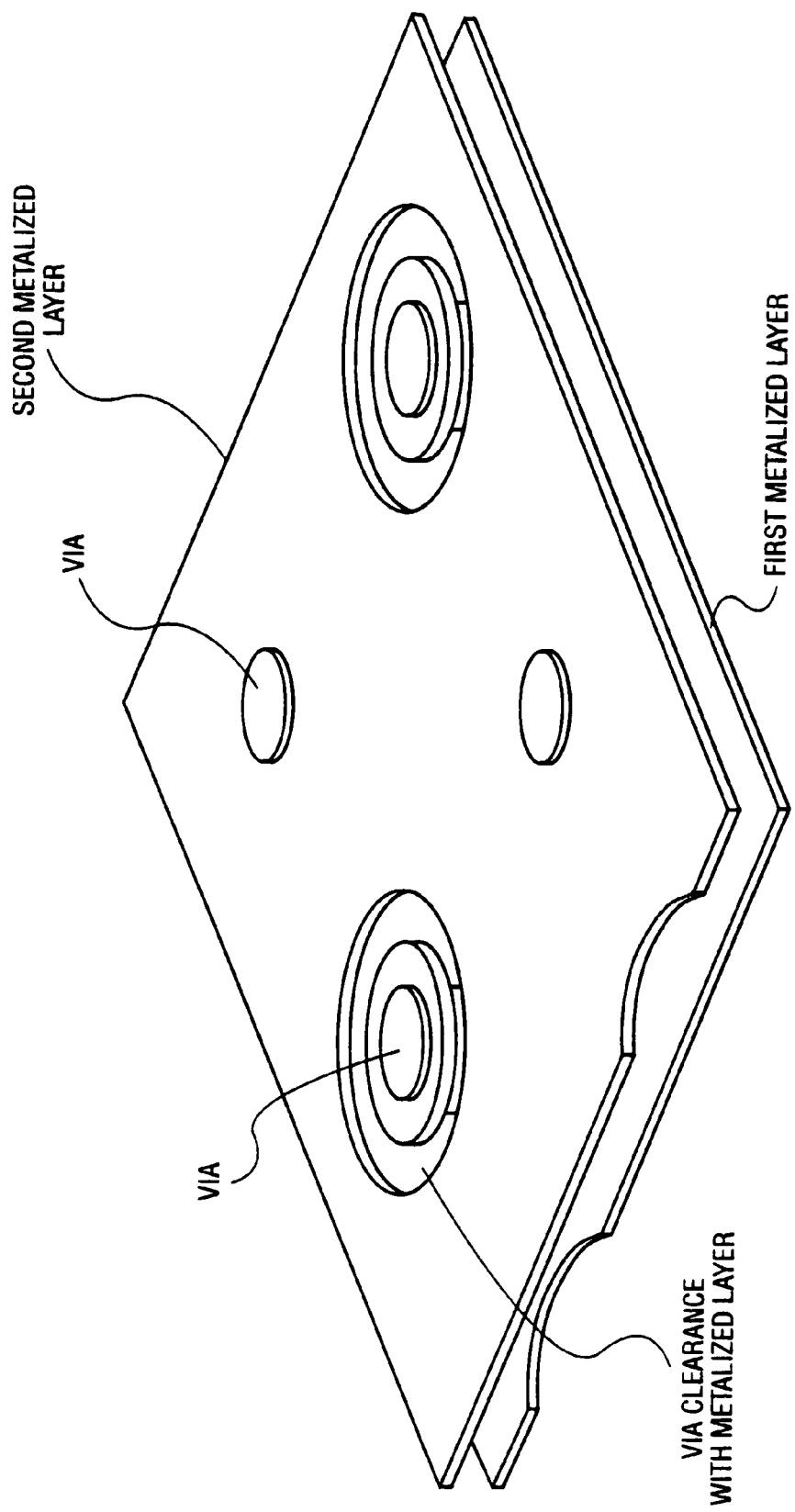
FIG. 1 illustrates a multiple layer printed circuit board where layered beneath the interconnect layers (not shown) is a first metalized layer to provide power, and a second metalized layer to provide ground.

A method and apparatus is disclosed for creating and utilizing conductive trenches to improve power delivery, EMI suppression, and/or thermal dissipation within a PCB structure. This method and apparatus can segment one or more metalized layers (planes) separated by a dielectric such that the use of the trenches can be realized effectively in a package interconnect/via field. For purposes of discussing the invention, it is to be understood that various terms are used by those knowledgeable in the art to describe apparatus, techniques, and approaches.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in gross form rather than in detail in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

This invention allows improved current carrying capability, decreased voltage droop, and/or improved thermal transfer by adding channels thereby increasing the surface areas in the direction of the current flow. The channels can be made from an electrically conductive material and the result can be an increase in cross-sectional area in the direction of current flow. Such electrically conductive material can be, for example, metals, metalized paste, or electrically conductive polymers. The channels can be made from a material that is thermally conductive and can result in an increase in thermal conduction along this increased cross-sectional area. Such thermally conductive materials can be materials such as, for example, metals, pastes, and filled-polymer composites. Further, the channels can be made from a material that is both thermally conductive and electrically conductive such as, for example, metals, metalized polymers, conductive composite pastes, etc.

The channel (trench) is formed by selectively removing portions of the outer metalized layers and portions of base material layers placed between the outer metalized layers. The PCB can have as base material, i.e. as one or more non-conducting layers, a laminate such as, for example, an epoxy resin reinforced with glass fiber, where one such fiberglass version is FR4. In addition, the trench can be deep enough to also remove portions of one or more of the inner metalized layers placed between the outer metalized layers. The trench can be formed such that the direction (length) of the trench is along a path where added cross-sectional area is desired (in the case of power delivery, the trench can be in the direction of current flow). The trench can be formed by such techniques as laser ablation, photo-developed patterning, plasma, chemical, or mechanical. The bare trench can then be provided a coating such as with one of the electrically and/or thermally conductive materials mentioned above and hereafter referred to as a conductive coating. The cross-section of this conductive coating within the trench can provide a conductive path having the improved cross-sectional area. By increasing the cross-sectional area, the per unit length resistance drops accordingly and the reduced resistance decreases the IR (current multiplied by resistance) drop of a power delivery circuit. This increase in cross-sectional area that improves the ability of the path to carry electrical current can also conduct heat and the surfaces of the conductive coating can dissipate heat. The trench, now having a conductive coating (i.e. a conductive trench), can radiate and convect heat off the conductive surface to remove heat from the interior of the PCB. This can occur where the trench makes a conductive connection between an inner layered circuit/plane and an outermost (exposed) circuit/plane such that the thermal dissipation of the interior circuit/plane is improved.

Figure 2:
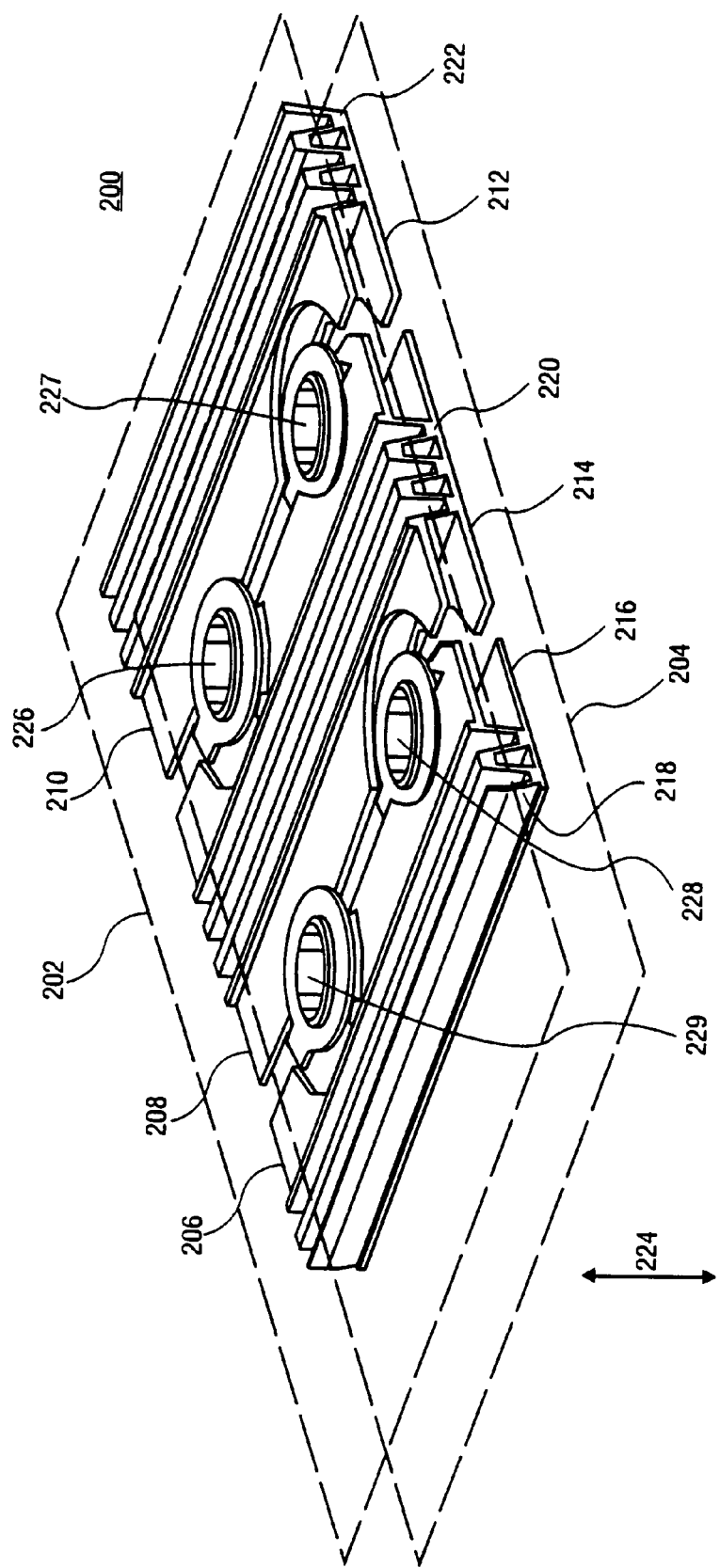
FIG. 2 is an illustration of one embodiment of segmented power and ground planes connected by conductive trenches

FIG. 2 is an illustration of one embodiment of segmented power and ground planes connected by trenches and vias. As shown in FIG. 2, an upper metalized plane 202 (plane) and a lower metalized plane 204 can be separated by a dielectric (removed for clarity) on a printed circuit board (PCB) 200. The upper and lower metalized planes 202 and 204 are shown as generalized planes, i.e. no specific boundaries, with phantom lines. The upper and lower metalized planes 202 and 204 can be segmented, where the separated upper segments 206, 208, and 210 can be connected to the separated lower segments 212, 214, and 216 by conductive trenches 218, 220, and 222. The upper 206, 208, 210 and lower 212, 214, 216 segments can be stacked so that equal potential segments (i.e. having equal or nearly equal areas) are aligned in the vertical axis 224 for connection by the respective conductive trenches 218, 220, and 222.

A trench is formed by pattern etching the metalized planes 202 and 204 and then by removing the dielectric material separating the planes 202 and 204. Each trench 218, 220, and 222 is then coated with a conductive material to provide an electrical and/or thermal connection between the upper segments 206, 208, and 210 and lower segments 212, 214, and 216. The coating thickness of the conductive trench can be made to provide cross-sections greater than cross section areas attained without a trench for either of the metalized planes 202 and 204. A segment 210 and 208 can be patterned to surround and electrically connect one or more vias 226 and 229 respectively and to a trench 222 and 220 resp., or alternatively, a segment 210 and 208 can be patterned to surround yet remain spaced apart (i.e. not connect) from a via 227 and 228 resp.

Figure 3A:
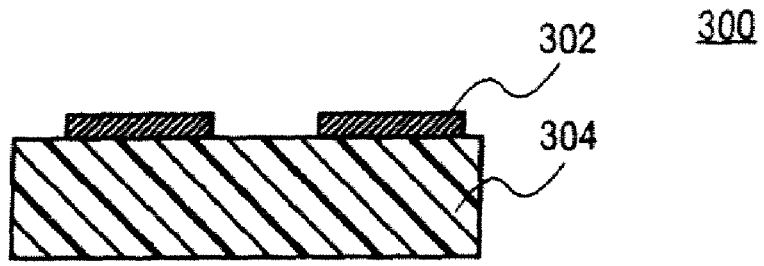
FIG. 3A is an illustration of a patterned first metal coating layer over a core dielectric material.

FIGS. 3A-3D illustrate one embodiment of a method for fabrication of segmented metalized planes connected by conductive trenches and vias on a PCB. FIG. 3A is an illustration of a patterned first metalized layer over a core base material. The first metalized coating 302 can be copper that is blanket deposited by several methods such as, for example, CVD or lamination. Patterning, after depositing the metal layer 302, can include developing an image in a photoresist coating placed over the metal layer. An etch process can then segment the copper layer 302, exposing the underlying base material 304.

Figure 3B:
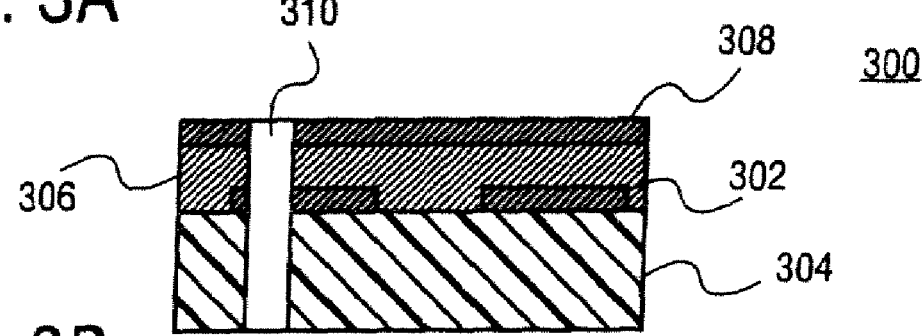
FIG. 3B is an illustration of the PCB after a dielectric layer is deposited over the patterned first metal coating layer, a second metal coating deposited/laminated over the second dielectric, and a via drilled through the PCB layers.

FIG. 3B is an illustration of a second metalized layer and a dielectric layer deposited over the first metalized layer. A second dielectric layer 306 is deposited over the patterned first metalized coating 302. Next, a second metalized coating 308 is deposited or laminated over the second dielectric 306, and a via 310 can be drilled through the PCB layers. The second metalized coating 308 can be copper and the second dielectric 306 can be an epoxy resin.

Figure 3C:
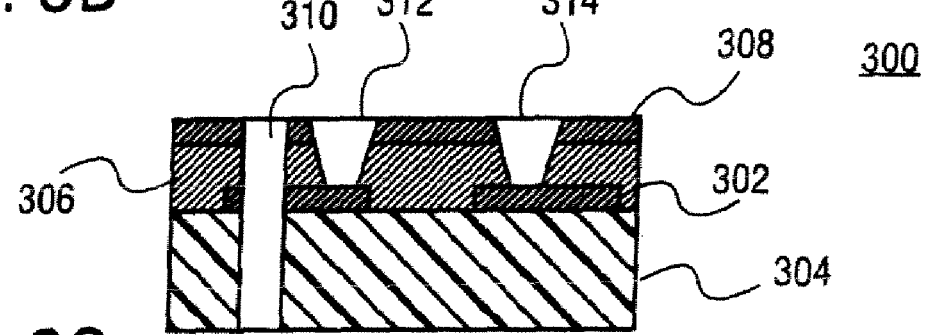
FIG. 3C is an illustration of the start of trench formation by first creating a groove through the second metal layer and the second dielectric layer to expose portions of the first metal layer.

FIG. 3C is an illustration of the start of trench formation. Grooves 312 and 314 can be etched or ablated through the second metal layer 308 and the second dielectric 306 layer to a depth that exposes circuit traces in the first metal layer 302. Etching/ablating the grooves 312 and 314 in the dielectric 306 can be accomplished by any number of processes such as, for example, mechanical imprinting, chemical etching, mechanical routing, or laser ablation. For mechanical imprinting, one method can use a metal die (not shown) that has a male pattern of the trenches to be placed into the substrate. Mechanically pressing the die onto the substrate can displace material and form the trenches. The process to remove metal from an area of the trench 312 and 314 in metal layer 308 can be different from a process to remove the dielectric material 306 in the same trench area.

Figure 3D:
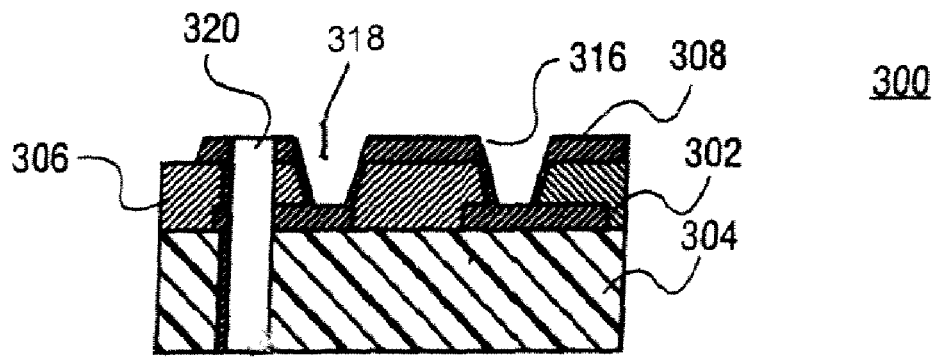
FIG. 3D is an illustration of the trenches and via after a metalizing process.

FIG. 3D is an illustration of conductive trenches 316 and 318 and coated via 320 after a coating process such as, for example, CVD, sputtering, electroless plating, electrolytic plating, or a combination of such processes. The coating can cover the trench 312 and 314 (FIG. 3C above) surfaces to create an increased conductive cross-section area where such area can be dimensionally tuned by controlling the volume of conductive material, such as, for example, metal deposits, polymers, or pastes, that is deposited.

Figure 4A:
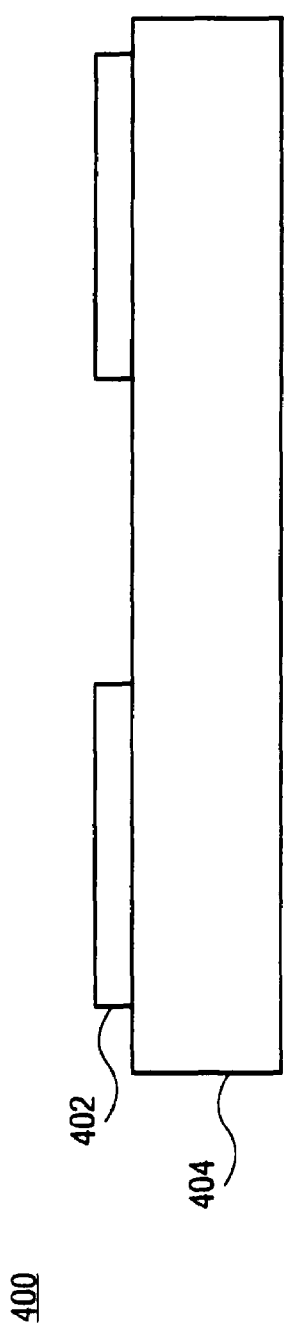
FIG. 4A-4D are an illustrations of another embodiment for fabricating metalized trenches.

FIGS. 4A-4D illustrate an alternate embodiment of a method for fabrication of segmented metalized planes connected by conductive trenches and vias on a PCB. FIG. 4A is an illustration of a patterned first metalized layer over a core base material that is a dielectric. The first metalized coating 402, such as copper, can be blanket deposited by several methods such as, for example, CVD or lamination. Patterning, after depositing the metalized layer 402, can include developing an image in a photoresist coating placed over the metal layer. Etching can then segment the metalized layer 402, exposing the underlying base material 404.

Figure 4B:
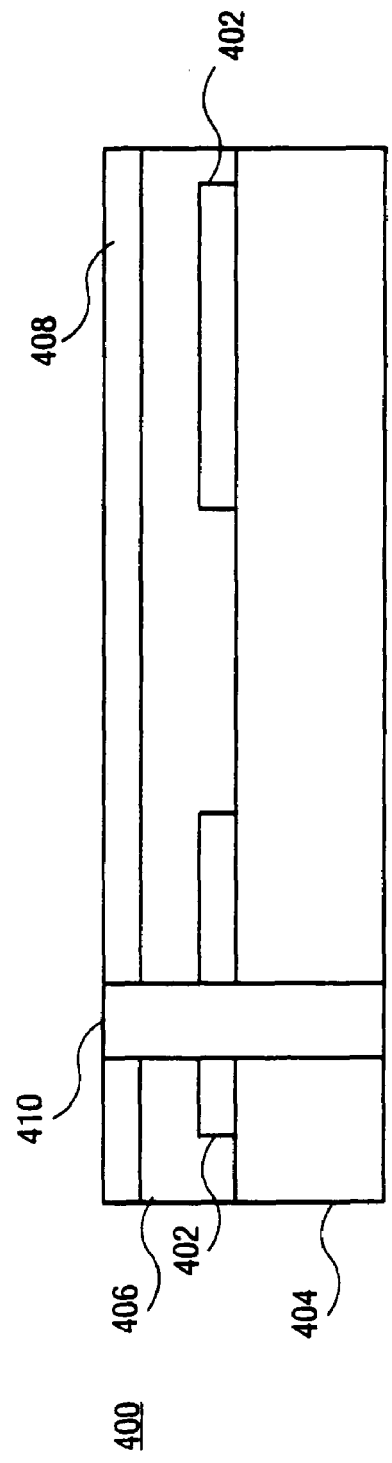

FIG. 4B is an illustration of a second metalized layer and a dielectric layer deposited over the first metalized layer. The second dielectric layer 406 can be deposited over the patterned first metalized coating 402. Next, a second metalized coating 408 can be deposited or laminated over the second dielectric 406, and then a via 410 can be drilled through the PCB layers. The second metalized coating 408 can be copper and the second dielectric 406 can be an epoxy resin.

Figure 4C:
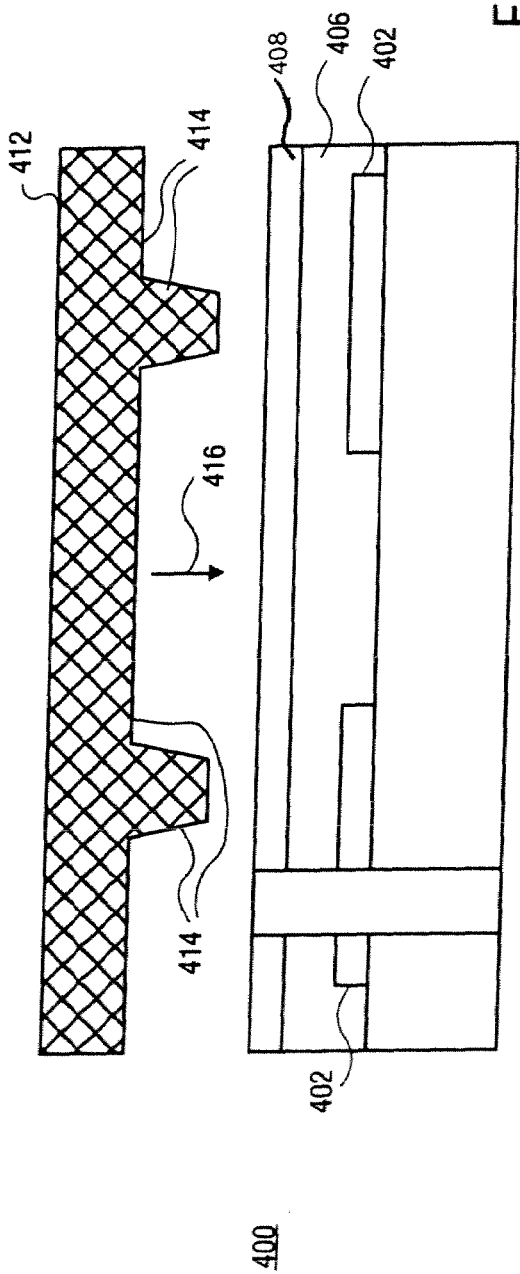

FIG. 4C is an illustration of creating an imprint that results in conductive trench formation. Mechanical imprinting, such as by using a metal die 412 that has a male pattern 414 (i.e. mirror image of the trenches to be manufactured), can be pressed 416 onto the second or top metalized layer 412 of the substrate 400.

Figure 4D:
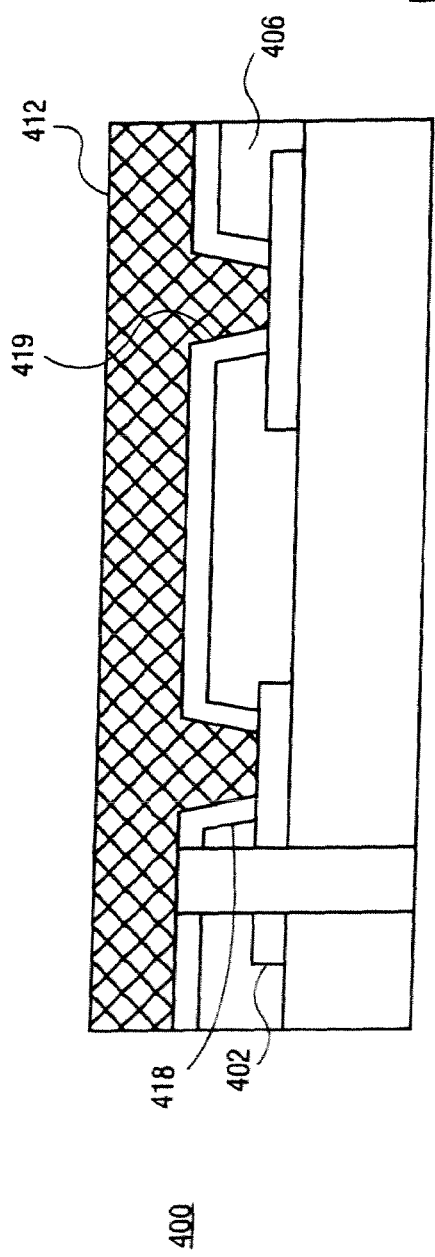

FIG. 4D is an illustration of the metal die pressed into the substrate creating the conductive trenches. Mechanically pressing the metal die 412 onto the substrate 400 can simultaneously displace both the metalized layer 408 and the dielectric material 406 to form the conductive trenches 418 and 419.

The process to remove or displace dielectric material to create the trenches can be different from a process used to displace or remove the metalized layer.

Figure 5:
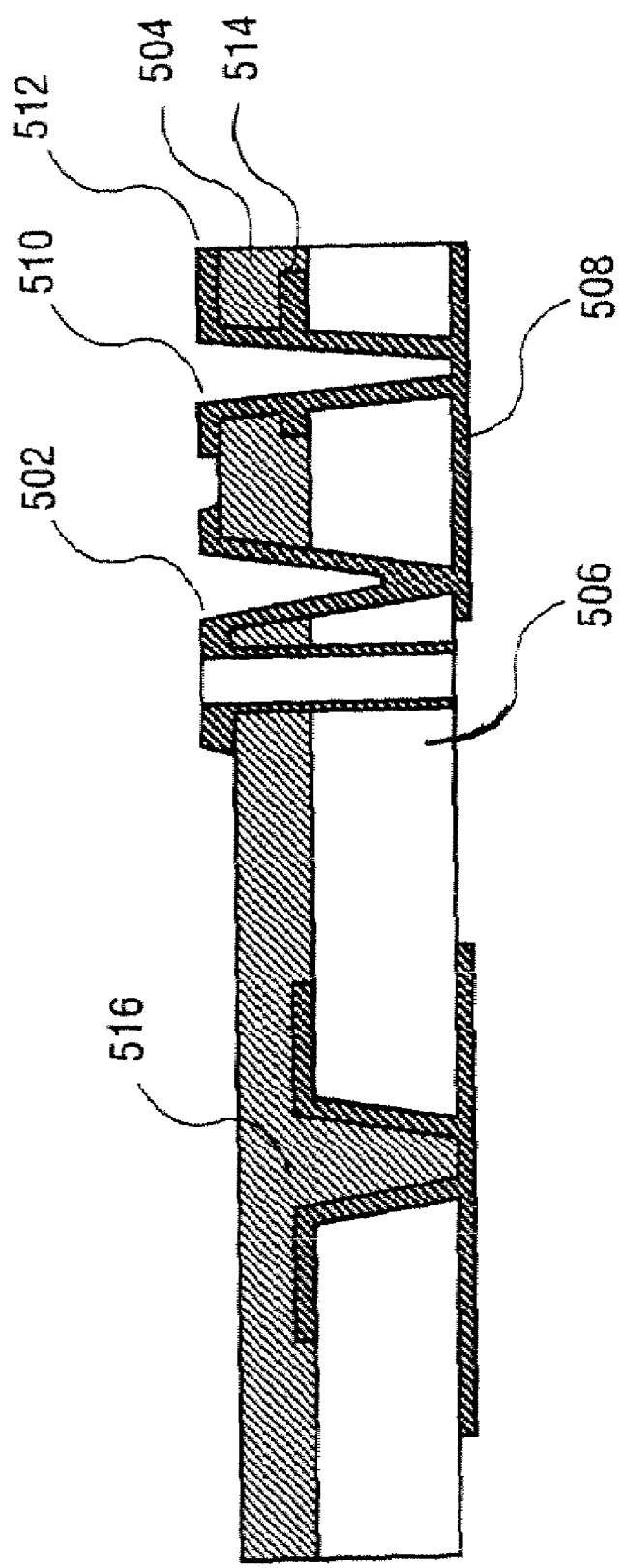
FIG. 5 is an illustration of other embodiments of conductive trenches connecting segmented metalized planes on a PCB.

FIG. 5 is an illustration of other embodiments of conductive trenches connecting segmented metalized planes on a PCB. Using the same processes as described above (FIGS. 3A-3D), metalized trenches 502 and 510 can be made deeper and can connect more than two metalized layers 512, 514, and 508. FIG. 5 illustrates a first metalized trench 502 that is formed such as by etch through two layers of dielectric 504 and 506 to expose a third metal layer 508 on the bottom of the PCB. A second metalized trench 510 is also illustrated that is placed through two dielectric layers 504 and 506 to connect tracings on three metal layers 508, 512, and 514. A third trench 516 can connect the second metalized layer 514 with the third metalized layer 408.

With further alternate embodiments, a variety of combinations are possible, such as, for example, it may be that trenches such as, for example, deeper trenches connect to only one metal layer to increase the surface area of a first metal layer only to improve heat conduction and/or to improve electrical conductivity.

Figure 6:
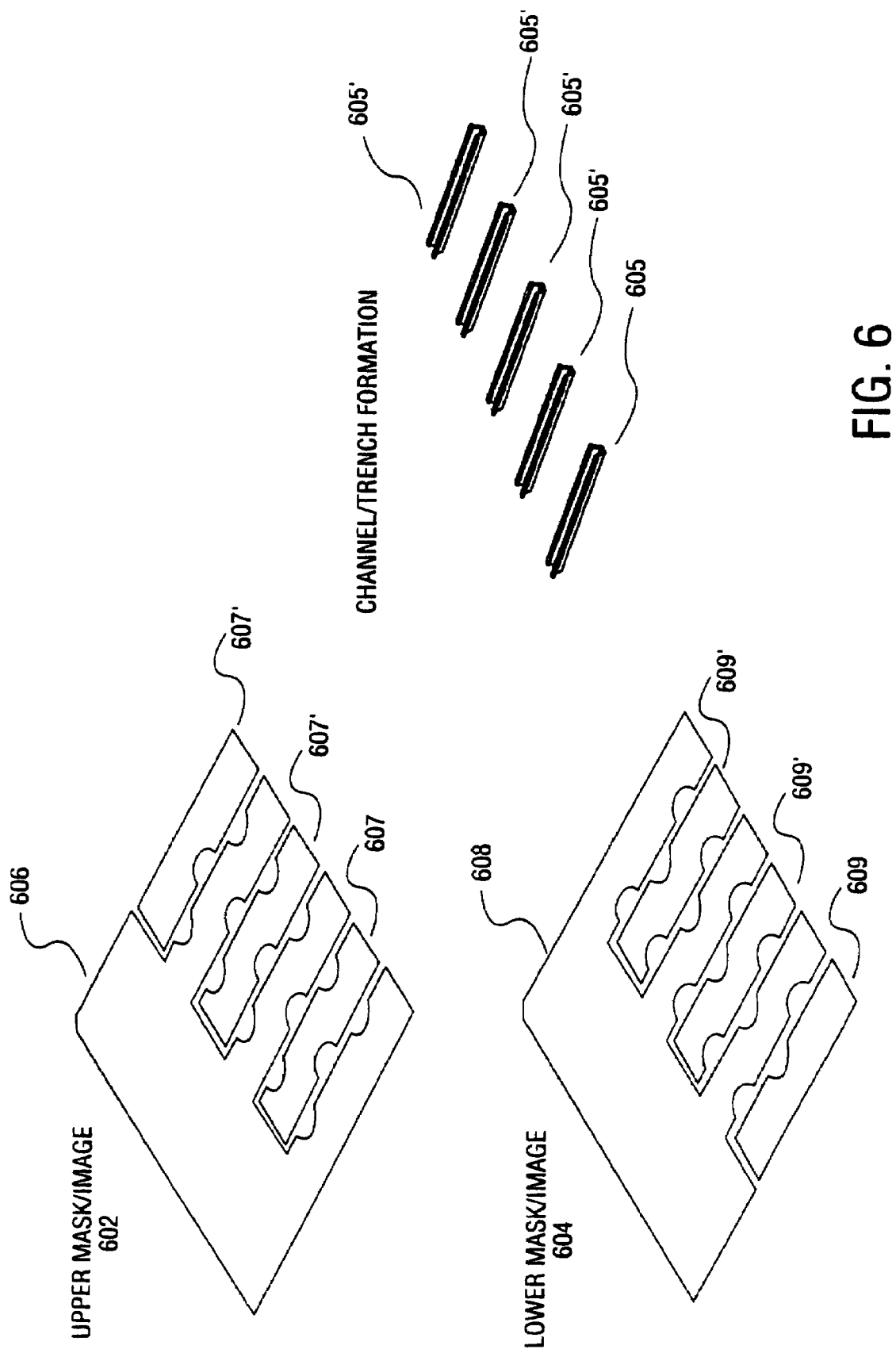
FIG. 6 is an illustration of a 3D view of metalized trenches and segmented surfaces.

FIG. 6 is a 3D illustration of one embodiment for patterns that define segments of a single plane pair 602 and 604, a first metal layer 602 and a second metal layer 604 where the segments of the two metal layers 602 and 604 to be connected by trenches 605 can be positioned opposing each other. In this embodiment, the upper mask image 602 can later be connected to a (+) potential and the lower mask image 604 to a (−) potential. The larger surface area 606 in the upper mask image 602 can connect to the series of smaller surface area segments or fingers 609 and 609' of the lower mask image 604. Conversely, the larger surface area 608 in the lower mask image 604 can connect to the series of smaller surface area segments or fingers 607 and 607' in the upper mask image 602. FIG. 6 is one embodiment that allows multiple electrical or thermal potentials to be realized in two or more surfaces that are conductively connected via the trenches to allow for segmenting two or more surfaces for connections into typical alternating power-ground fields used in electronic packages.

Figures 7A, 7B:
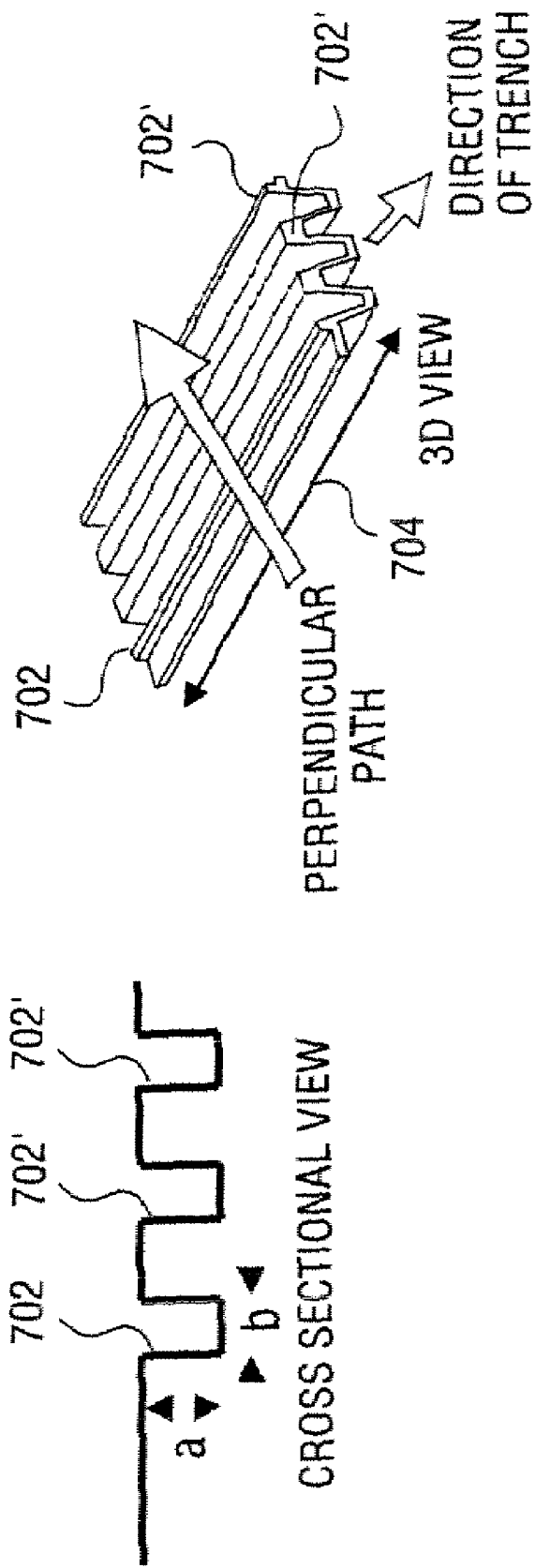
FIG. 7A illustrates cross-sectional area increase with the number of metalized trenches and the increased surfaces that define the trench.
FIG. 7B illustrates the metalized trenches from the side (perpendicular to the length of the trench).

FIGS. 7A and 7B are illustrations of the cross-sectional of a metalized trench. Illustrated in FIG. 7A, cross-sectional area increases with the number of metalized trenches 702 and 702' and the increased surfaces that define the trench. In the case of a rectangular trench, the increase in surface area, for each metalized trench 702 and 702' is related to the length of trench sidewall a and width of sidewall b. As shown in FIG. 7B, when viewing the metalized trenches 702 and 702' from the side (perpendicular to the length of the trench), the cross-sectional area is unchanged and the conductive path 704 is longer by (2a) for each trench 702 and 702' crossed. In the case of power delivery, through the interstitial grid of a package (not shown), the number of metalized trenches that can be placed between package pins is a function of the metalized trench width (a) and aspect ratio capability of the metalization method. The surface area of the trench and cross-sectional area after conductive coating can be controlled or increased by shaping edges and contours of the trench surface.

Figure 8A:
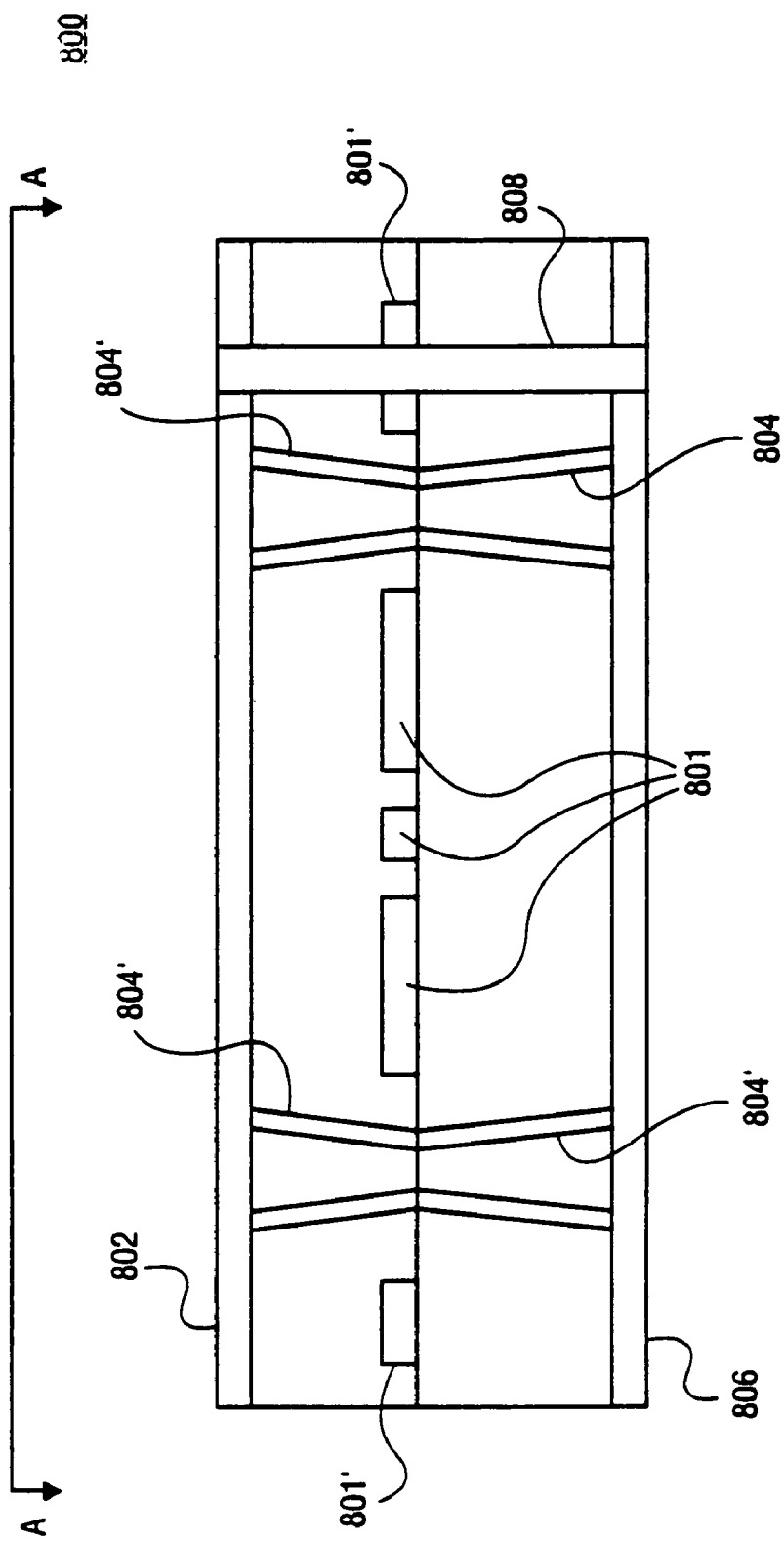
FIG. 8A is an illustration of an alternate embodiment where conductive trenches can be used to fabricate a Faraday cage within the PCB substrate.
Figure 8B:
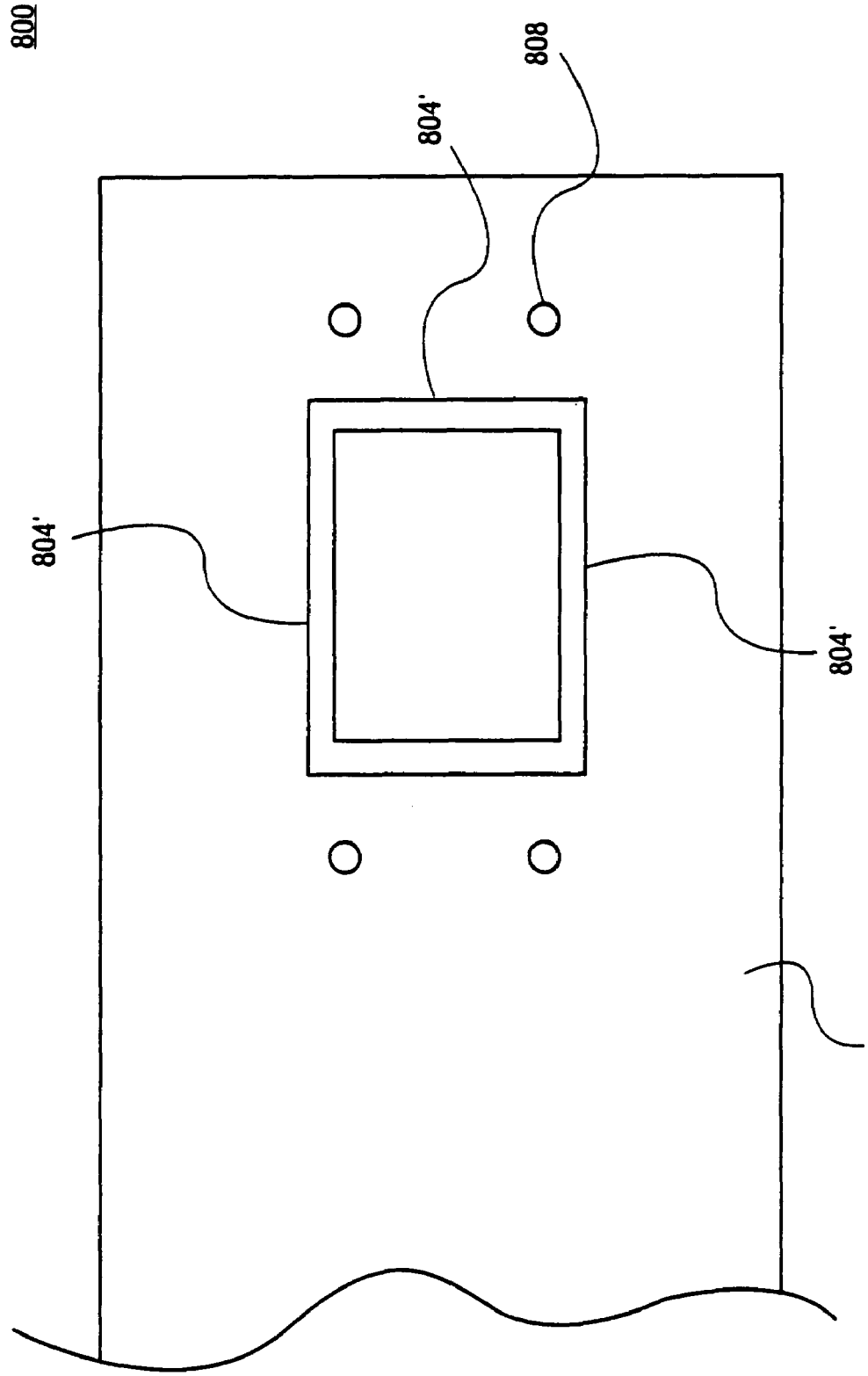
FIG. 8B is an illustration of the alternate embodiment with a top view of conductive trenches that form part of the Faraday cage.

FIGS. 8A & 8B illustrate an alternate embodiment of conductive trenches that can be used to fabricate a Faraday cage within the PCB substrate. The present invention can be a novel device structure for shielding individual circuitry from conductive and/or radiated energy. Such as, for example, electromagnetic interference (EMI) from radiation originating outside the printed circuit board or from adjacent devices on the PCB. In an alternate embodiment, a Faraday cage is constructed on and/or within a PCB substrate, to enclose PCB circuitry within a structure of metal.

Usually a complete conductive shell, a Faraday cage collects stray charges and, because like charges repel, stores them on the outside surface (where they can be further apart than on the inside). The electric fields generated by these charges then cancel each other out on the inside of the cage. A Faraday cage is often used to protect sensitive radio equipment.

As shown FIG. 8A is a cross-section of a PCB having individual circuitry surrounding by a Faraday cage. FIG. 8B is a top view of a conductive trench forming part of the Faraday cage. A number of conductive trenches 804 can be fabricated by the methods described above. In one embodiment, circuitry 801 and 801' can be formed on layers within the PCB 800. Trenches can be formed in both sides 802 and 804 of the PCB. The top surface 802 and the bottom surface 806 can have a metalized layer deposited. The trenches 804 and 804' can be formed in a closed or nearly closed loop, i.e., for example, a square as shown here. As a result, selected circuitry can be enclosed within the trench-bottom/top surfaces thus shielding the selected circuitry with a Faraday cage. Other circuitry 801' and vias 808 can be placed outside the Faraday cage. Alternatively, vias (not shown) can be placed through the structure of the Faraday cage allowing for some degradation of the effectiveness of the Faraday cage.

Thus a method and apparatus for joining two or more metalized planes with a series of metalized trenches having cross-section areas that can increase the thermal and/or electrical conductive path from one or more metalized planes has been described. In addition, a series of metalized planes and conductive trenches can be positioned such as to create a Faraday cage protecting electrical circuitry and/or electrical devices within. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method comprising:

forming a first and second conductive plane having a first dielectric material there between, wherein the first conductive plane is segmented into a first plurality of conductive portions; and the second conductive plane is segmented into a second plurality of conductive portions;

forming a number of conductive channels through said first conductive plane in said dielectric material, wherein each of the number of the conductive channels has in the first conductive plane a length that is greater than a width, wherein the first plurality of conductive portions are aligned to the second plurality of conductive portions for connection by said number of conductive channels, wherein a conductive cross-sectional area of at least the first conductive plane increases with the number of conductive channels, wherein at least one of said number of conductive channels connects said first conductive plane to said second conductive plane.

2. The method of claim 1 further comprising:

segmenting said first conductive plane into the first plurality of conductive portions;

segmenting said second conductive plane into the second plurality of conductive portions; and connecting at least one of said first plurality of conductive portions of said first conductive plane to at least one of said second plurality of conductive portions of said second conductive plane with at least one of said number of conductive channels.

3. The method of claim 1 wherein said first and second conductive planes are formed of a thermal conductive material.

4. The method of claim 1 further comprising:

forming a second dielectric layer on said second conductive plane;

forming a third conductive material on said second dielectric layer; and connecting the first, second, and third conductive planes with at least one of said number of conductive channels.

5. The method of claim 1 wherein said first and second conductive planes are formed of electrically conductive material.

6. The method of claim 2 wherein connecting said first plurality of conductive portions of said first conductive plane to said second plurality of conductive portions of said second conductive plane configures one group of said first plurality of conductive portions to be maintained at one potential and another group of said second plurality of conductive portions to be maintained at a second potential.

* * * * *